(12) United States Patent
Yu et al.

(10) Patent No.: US 10,163,475 B2
(45) Date of Patent: Dec. 25, 2018

(54) NON-VOLATILE MEMORY DEVICE HAVING DUMMY CELLS AND MEMORY SYSTEM INCLUDING THE SAME

(71) Applicant: SAMSUNG ELECTRONICS CO., LTD., Suwon-si, Gyeonggi-Do (KR)

(72) Inventors: Chang-Yeon Yu, Hwaseong-si (KR); June-Hong Park, Seongnam-si (KR); Seong-Jin Kim, Gimpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/647,658

(22) Filed: Jul. 12, 2017

(65) Prior Publication Data

US 2018/0166111 A1    Jun. 14, 2018

(30) Foreign Application Priority Data

Dec. 14, 2016    (KR) .................. 10-2016-0170412

(51) Int. Cl.
| G11C 7/00 | (2006.01) |
| G11C 7/22 | (2006.01) |
| G11C 7/12 | (2006.01) |
| G11C 7/14 | (2006.01) |
| G11C 7/18 | (2006.01) |
| G11C 8/14 | (2006.01) |
| G11C 29/02 | (2006.01) |
| G11C 16/04 | (2006.01) |
| G11C 16/08 | (2006.01) |
| G11C 16/10 | (2006.01) |
| G11C 16/32 | (2006.01) |

(52) U.S. Cl.
CPC ............ *G11C 7/227* (2013.01); *G11C 7/12* (2013.01); *G11C 7/14* (2013.01); *G11C 7/18* (2013.01); *G11C 7/22* (2013.01); *G11C 7/225* (2013.01); *G11C 8/14* (2013.01); *G11C 16/0483* (2013.01); *G11C 16/08* (2013.01); *G11C 16/10* (2013.01); *G11C 16/32* (2013.01); *G11C 29/02* (2013.01)

(58) Field of Classification Search
CPC .......... G11C 7/227; G11C 7/225; G11C 7/12; G11C 7/14; G11C 7/18; G11C 7/22
USPC ............................... 365/203, 185.2, 185.25
See application file for complete search history.

(56) References Cited

U.S. PATENT DOCUMENTS

| 7,262,994 B2 | 8/2007 | Fong et al. |
| 7,272,049 B2 | 9/2007 | Kang et al. |

(Continued)

FOREIGN PATENT DOCUMENTS

| KR | 100704025 | 3/2007 |
| KR | 1020080085409 | 3/2007 |

(Continued)

*Primary Examiner* — Viet Q Nguyen
(74) *Attorney, Agent, or Firm* — Volentine, Whitt & Francos, PLLC

(57) ABSTRACT

A non-volatile memory device includes a cell string, a ground select transistor, and at least one dummy cell. The cell string includes at least one memory cell. The at least one dummy cell is provided between the at least one memory cell and the ground select transistor and is connected to a bit line. A controller executes dummy cell control logic configured to control a gate voltage of the at least one dummy cell to be lower than a threshold voltage of the at least one dummy cell in at least a part of a pre-charge period.

18 Claims, 16 Drawing Sheets

(56) References Cited

U.S. PATENT DOCUMENTS

| | | | |
|---|---|---|---|
| 7,310,280 B2 | 12/2007 | Park et al. | |
| 8,089,811 B2 | 1/2012 | Kang et al. | |
| 8,134,873 B2 | 3/2012 | Choi et al. | |
| 8,218,365 B2* | 7/2012 | Kim | G11C 11/5642 |
| | | | 365/185.17 |
| 8,574,750 B2* | 11/2013 | Tsutsumi | H01M 2/024 |
| | | | 429/157 |
| 9,013,923 B2 | 4/2015 | Park | |
| 9,349,465 B2* | 5/2016 | Jang | G11C 16/24 |
| 9,514,828 B2* | 12/2016 | Shim | G11C 16/24 |
| 9,685,209 B1* | 6/2017 | Dhori | G11C 7/12 |
| 9,721,664 B2* | 8/2017 | Nam | G11C 16/10 |
| 2007/0019485 A1* | 1/2007 | Sumitani | G11C 7/22 |
| | | | 365/203 |
| 2009/0168536 A1* | 7/2009 | Chung | G11C 16/10 |
| | | | 365/185.18 |
| 2014/0056092 A1 | 2/2014 | Lee | |
| 2016/0027504 A1* | 1/2016 | Lee | G11C 11/5635 |
| | | | 365/185.03 |

FOREIGN PATENT DOCUMENTS

| | | |
|---|---|---|
| KR | 1020100028191 | 9/2008 |
| KR | 100908540 | 7/2009 |
| KR | 101478149 | 12/2014 |

* cited by examiner

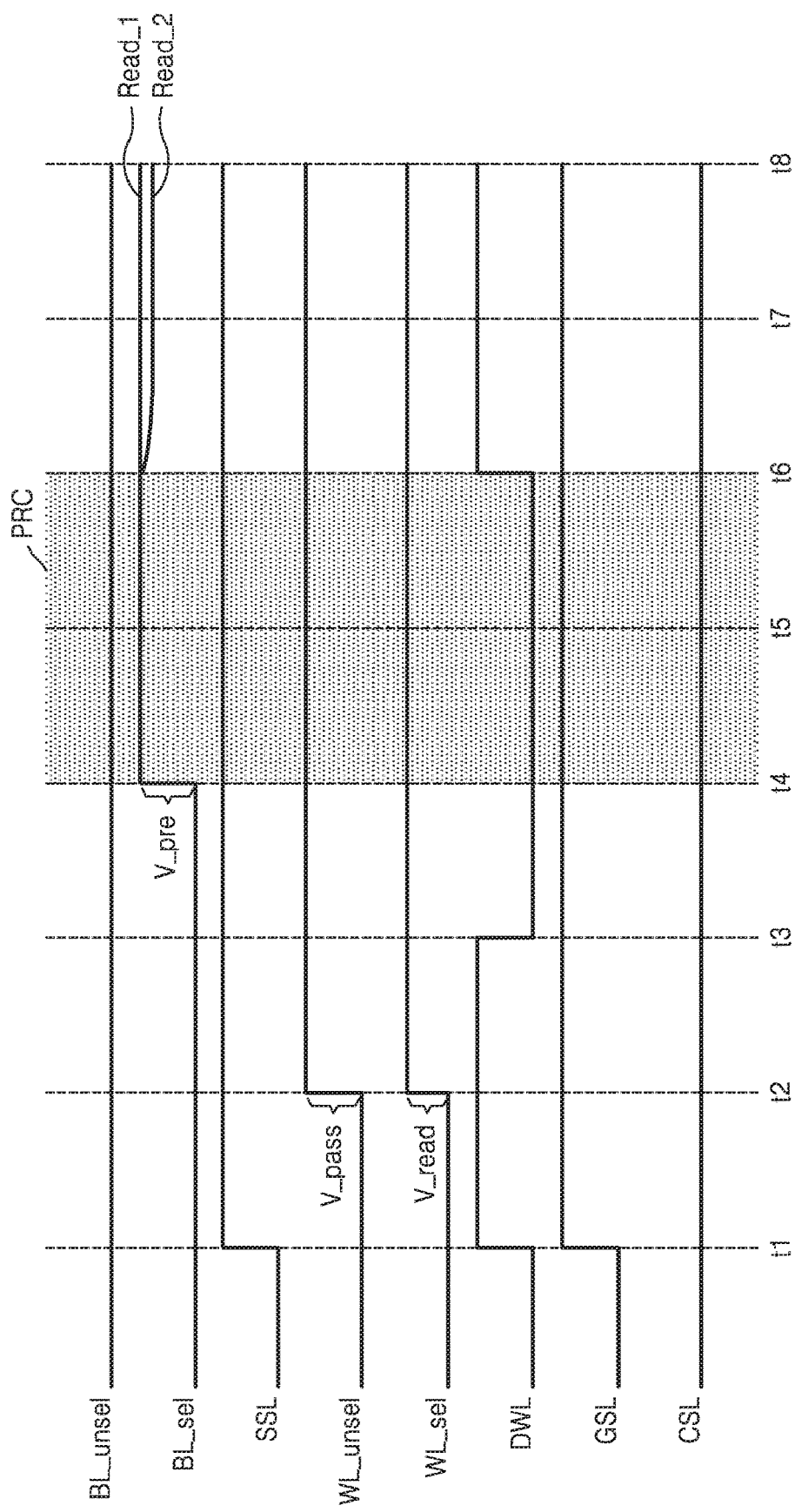

NON-VOLATILE MEMORY DEVICE HAVING DUMMY CELLS AND MEMORY SYSTEM INCLUDING THE SAME

CROSS-REFERENCE TO RELATED APPLICATION

This U.S. non-provisional patent application claims priority under 35 U.S.C. § 119 to Korean Patent Application No. 10-2016-0170412, filed on Dec. 14, 2016 in the Korean Intellectual Property Office (KIPO), the disclosure of which is incorporated herein in its entirety by reference.

BACKGROUND

1. Technical Field

The present disclosure relates to a non-volatile memory device. More particularly, the present disclosure relates to a non-volatile memory device having dummy cells, and a memory system including the non-volatile memory device.

2. Discussion of the Related Art

Memory devices are largely classified into volatile memory devices and non-volatile memory devices. A non-volatile memory device is a memory device maintaining data stored therein even if power supply stops (e.g., is blocked). An example of the non-volatile memory device is a flash memory device. The flash memory device includes memory cells having different states according to data stored therein. Memory cells are connected to bit lines in a cell string-based unit to perform a program or read operation, etc.

SUMMARY

The present disclosure describes a non-volatile memory device having dummy cells, and a memory system including the non-volatile memory device.

According to an aspect of the present disclosure, a non-volatile memory device includes a cell string and a controller. The cell string includes at least one memory cell, a ground select transistor, and at least one dummy cell between the at least one memory cell and the ground select transistor and connected to a bit line. The controller is configured to control a gate voltage of the at least one dummy cell to be lower than a threshold voltage of the at least one dummy cell in at least a part of a pre-charge period (time segment).

According to another aspect of the present disclosure, a non-volatile memory device includes a memory cell array, a page buffer and a controller. The memory cell array includes multiple cell strings each including at least one dummy cell. The page buffer is connected to the memory cell array through multiple bit lines and pre-charges at least one of the bit lines. The controller is configured to control a gate voltage of the at least one dummy cell and to control a turn off voltage of the at least one dummy cell to be applied to a gate of the at least one dummy cell in at least a part of a pre-charge period in which the page buffer pre-charges at least one of the bit lines.

BRIEF DESCRIPTION OF THE DRAWINGS

Embodiments of the present disclosure will be more clearly understood from the following detailed description taken in conjunction with the accompanying drawings in which:

FIG. 3 is a timing diagram of operations of various signals according to an example embodiment;

DETAILED DESCRIPTION OF THE EMBODIMENTS

Figure 1:
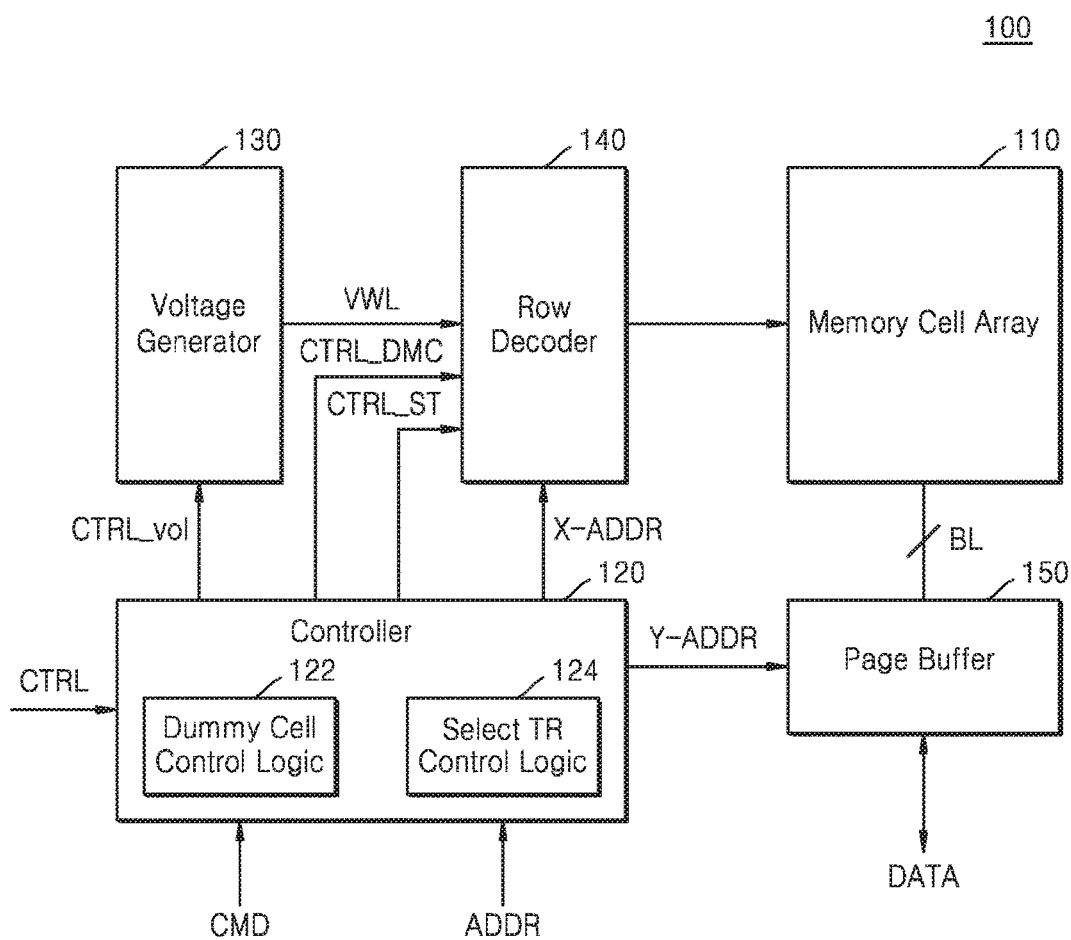
FIG. 1 is a block diagram showing a memory device according to an example embodiment.

FIG. 1 is a block diagram showing a memory device 100 according to an example embodiment.

Referring to FIG. 1, the memory device 100 may include a memory cell array 110, a controller 120, a voltage generator 130, a row decoder 140, and a page buffer 150. Although not shown, the memory device 100 may further include a data I/O circuit or an I/O interface.

The controller 120 may be a processor. A processor for a memory device 100 is tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A processor is an article of manufacture and/or a machine component. A processor for a memory device 100 is configured to execute software instructions in order to perform functions as described in the various embodiments herein. A processor for a memory device 100 may be a general-purpose processor or may be part of an application specific integrated circuit (ASIC). A processor for a memory device 100 may also be a microprocessor, a microcomputer, a processor chip, a controller, a microcontroller, a digital signal processor (DSP), a state machine, or a programmable logic device. A processor for a memory device 100 may also be a logical circuit, including a programmable gate array (PGA) such as a field programmable gate array (FPGA), or another type of circuit that includes discrete gate and/or transistor logic. A processor for a memory device 100 may be a central processing unit (CPU), a graphics processing unit (GPU), or both. Additionally, any processor described herein may include multiple processors, parallel processors, or both. Multiple processors may be included in, or coupled to, a single device.

In an alternative embodiment, the controller 120 may use dedicated hardware implementations, such as application-specific integrated circuits (ASICs), programmable logic arrays and other hardware components, constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor.

Figure 2:
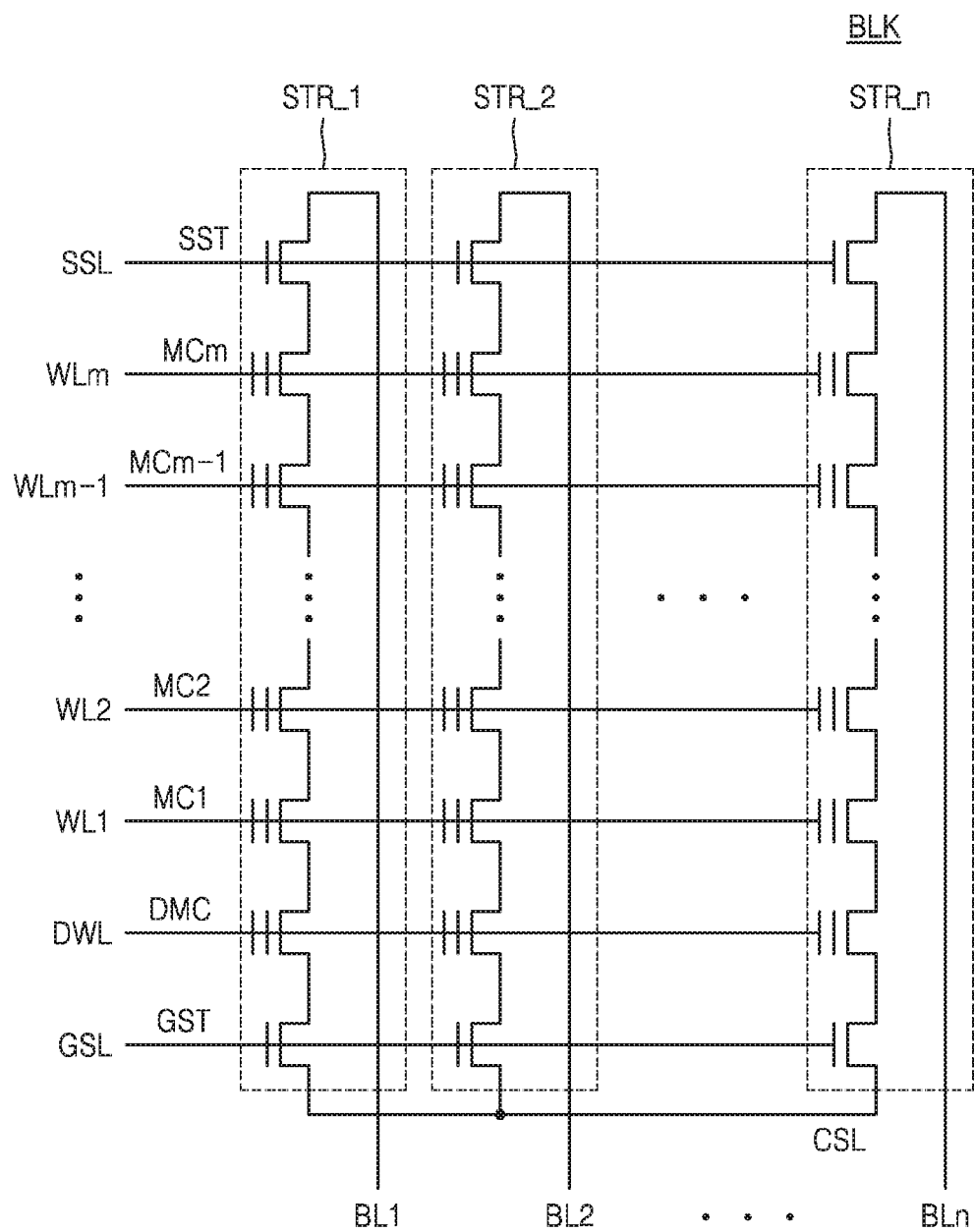
FIG. 2 is a circuit diagram of an equivalent circuit of a memory block included in a memory cell array of the memory device of FIG. 1.

As described blow with respect to, for example, FIG. 2, the memory cell array 110 may include multiple memory cells and may be connected to string select lines SSL, word lines WL, dummy word lines DWL, ground select lines GSL, and bit lines BL. Specifically, the memory cell array 110 may be connected to the row decoder 140 through the string select lines SSL, the word lines WL, the dummy word lines DWL, the ground select lines GSL, and may be connected to the page buffer 150 through the bit lines BL.

The memory cells included in the memory cell array 110 may be, for example, flash memory cells. Hereinafter, the embodiments will be described as an example in which the memory cells are NAND flash cells, which may also be referred to as NAND cells. However, the memory cells are not limited thereto. In another embodiment, the memory cells may be resistive memory cells such as resistive RAM (RRAM), phase change RAM (PRAM), or magnetic RAM (MRAM).

The memory cell array 110 may include multiple blocks each having a planar structure or a three-dimensional structure. The memory cell array 110 may include at least one of single level cell blocks including single level cells, multi level cell blocks including multi level cells, and triple level cell blocks including triple level cells. For example, some of the blocks included in the memory cell array 110 may be single level cell blocks and others thereof may be multi level cell blocks or triple level cell blocks.

The multiple blocks included in the memory cell array 110 may include multiple cell strings. Referring again to, for example, FIG. 2, the cell strings may include at least one memory cell connected to the word lines WL, at least one dummy memory cell connected to the dummy word lines DWL, and at least one ground select transistor connected to the ground select lines GSL. This will be described in detail below.

The controller 120 may output various control signals for writing or reading data to or from the memory cell array 110 based on a command CMD, an address ADDR, and a control signal CTRL that are received from a memory controller (not shown). Thus, the controller 120 may generally control various operations performed in the memory device 100.

Various control signals output from the controller 120 may be provided to the voltage generator 130, the row decoder 140, and the page buffer 150. Specifically, the controller 120 may provide a voltage control signal CTRL_vol to the voltage generator 130, provide a row address X-ADDR to the row decoder 140, and provide a column address Y-ADDR to the page buffer 150. However, the controller 120 is not limited thereto. The controller 120 may further provide other control signals to the voltage generator 130, the row decoder 140, and the page buffer 150.

In an example embodiment, the controller 120 may store and/or execute dummy cell control logic 122 and select transistor control logic 124. Alternatively, the controller 120 may include dummy cell control logic 122 and select transistor control logic 124 in the form of, for example, dedicated circuitry. The dummy cell control logic 122 may, when executed, generate a dummy cell control signal CTRL_DMC that controls dummy word line voltages for driving (to be applied to) the dummy word lines DWL, respectively. The select transistor control logic 124 may, when executed, generate a select transistor control signal CTRL_ST that control string select line voltages for driving (to be applied to) the string select lines SSL and/or ground select line voltages for driving (to be applied to) the ground select lines GSL, respectively.

In an example embodiment, the dummy cell control logic 122 may, when executed, generate the dummy cell control signal CTRL_DMC such that gate voltage levels of dummy cells included in the memory cell array 110 are respectively lower than threshold voltage levels of the dummy cells in at least a part of a pre-charge period (time segment) of the bit line BL. Thus, the dummy cell control logic 122 may, when executed, turn off the dummy cells included in the memory cell array 110 in the at least a part of the pre-charge period (time segment) of the bit line BL.

In an example embodiment, the dummy cell control logic 122 may control voltages for setting the threshold voltage levels of the dummy cells included in the memory cell array 110 to be applied to the dummy word lines DWL, respectively. The dummy cell control logic 122 may, when executed, sense a threshold voltage of a dummy cell, for example, every certain period, to determine whether the threshold voltage of the dummy cell has exceeded a certain value. When the dummy cell control logic 122 determines that the threshold voltage of the dummy cell has exceeded the certain value, the dummy cell control logic 122 may, when executed, reset the threshold voltage of the dummy cell. In an example embodiment, the dummy cell control logic 122 may, when executed, erase the dummy cell and then program again, thereby resetting threshold values of the dummy cells.

In an example embodiment, the select transistor control logic 124 may, when executed, generate the select transistor control signal CTRL_ST such that gate voltage levels of ground select transistors included in the memory cell array 110 are respectively higher than threshold voltage levels of the ground select transistors in the pre-charge period (time segment) of the bit line BL. In another example embodiment, the select transistor control logic 124 may, when executed, generate the select transistor control signal CTRL_ST such that the gate voltage levels of ground select transistors included in the memory cell array 110 are respectively lower than the threshold voltage levels of the ground select transistors in at least a part of the pre-charge period (time segment) of the bit line BL.

The voltage generator 130 may generate various types of voltages for performing program (or write), read, and erasure operations on the memory cell array 110 based on a voltage control signal CTRL_vol. Specifically, the voltage generator 130 may generate a word line voltage, for example, a program voltage, a read voltage, a program inhibit voltage, a read inhibit voltage, an erasure verify voltage, or a program verify voltage, etc. Also, the voltage generator 130 may further generate a string select line voltage and a ground select line voltage based on the voltage control signal CTRL_vol. Also, the voltage generator 130 may further generate an erasure voltage to be provided to the memory cell array 110.

The row decoder 140 may select some of the word lines WL in response to the row address X-ADDR received from the controller 120. Specifically, during the read operation, the row decoder 140 may apply the read voltage to the selected word line and apply the read inhibit voltage to a non-selected word line. Also, during the program operation, the row decoder 140 may apply the program voltage to the selected word line and may apply the program inhibit voltage to the non-selected word line. Also, the row decoder 140 may select some of the string select lines SSL in response to the row address X-ADDR received from the controller 120.

The row decoder 140 may select some of the dummy word lines DWL in response to the row address X-ADDR received from the controller 120. In an example embodiment, the row decoder 140 may apply a voltage lower than the threshold voltages of the dummy cells to at least one of the dummy word lines DWL based on the dummy cell control signal CTRL_DMC generated from the dummy cell control logic 122 in at least a part of the pre-charge period (time segment) of the bit line BL.

The row decoder 140 may select some of the ground select lines GSL in response to the row address X-ADDR received from the controller 120. In an example embodiment, the row decoder 140 may apply a voltage higher than the threshold voltages of the ground select transistors to at least one of the ground select lines GSL based on the select transistor control signal CTRL_ST generated from the select transistor control logic 124 in the pre-charge period (time segment) of the bit line BL. In another example embodiment, the row decoder 140 may apply a voltage lower than the threshold voltages of the ground select transistors to at least one of the ground select lines GSL based on the select transistor control signal CTRL_ST generated from the select transistor control logic 124 in at least a part of the pre-charge period (time segment0 of the bit line BL.

The page buffer 150 may be connected to the memory cell array 110 through the bit lines BL and may select some of the bit lines BL in response to the column address Y-ADDR received from the controller 120. Specifically, during the read operation, the page buffer 150 may act as a sense amplifier to sense data DATA stored in the memory cell array 110. During the program operation, the page buffer 150 may act as a write driver to apply a voltage according to the data DATA to be stored in the memory cell array 110 to the bit lines BL.

The page buffer 150 may selectively pre-charge the bit lines BL. The page buffer 150 may apply pre-charge voltages to the selected bit lines BL in the pre-charge period (time segment) and float the bit lines BL.

FIG. 2 is a circuit diagram of an equivalent circuit of a memory block BLK included in a memory cell array 110 of the memory device of FIG. 1.

Referring to FIG. 2, the memory block BLK may include multiple cell strings STR_1~STR_n that are connected between multiple bit lines BL1~BLn, n is a natural number equal to or greater than 2) and a common source line CSL. Each of the cell strings STR_1~STR_n may include a string select transistor SST, multiple memory cells MC1~MCm (m is a natural number equal to or greater than 2), a dummy cell DMC, and a ground select transistor GST. Each of the cell strings STR_1~STR_n includes one string select transistor SST, one dummy cell DMC, and one ground select transistor GST in FIG. 2 but is not limited thereto. In an example embodiment, the memory cell MCm adjacent to the string select transistor SST may act as a dummy cell.

Gates of the string select transistors SST included in the cell strings STR_1~STR_n may be connected to the string select line SSL. A string select voltage for controlling each of the string select transistors SST may be applied to the string select line SSL.

Each of the memory cells MC1~MCm may store one or more bits of data. Gates of the memory cells MC1~MCm of the cell strings STR_1~STR_n may be respectively connected to multiple word lines WL1~WLm. The memory cells MC1~MCm respectively connected to the word lines WL1~WLm may be referred to as pages. Word line voltages (for example, a program voltage, a pass voltage, a read voltage, and a read pass voltage) necessary for driving may be respectively applied to the word lines WL1~WLm.

The dummy cell DMC may be disposed between the memory cell MC1 and the ground select transistor GST. Gates of the dummy cells DMC included in the cell strings STR_1~STR_n may be respectively connected to the dummy word line DWL. A dummy word line voltage for controlling the dummy cell DMC may be applied to the dummy word line DWL. In an example embodiment, the dummy cell DMC may have a programmed state, i.e. a certain threshold voltage.

The ground select transistors GST may be disposed between the dummy cells DMC and the common source line CSL. Gates of the ground select transistors GST included in the cell strings STR_1~STR_n may be respectively connected to the ground select line GSL. A ground select voltage for controlling the ground select transistor GST may be applied to the ground select line GSL.

As described with respect to FIG. 2, cell strings STR_1~STR_n can be isolated to prevent energy dissipation by using dummy cells and a dummy word line. The timing diagrams described below explain how a pre-charge period of a bit line can be utilized for the isolating. The configuration may provide for a faster switching speed than using a ground select transistor and ground select line in a configuration that does not use the dummy cells and dummy word line.

FIG. 3 is a timing diagram of operations of various signals according to an example embodiment. FIG. 3 may show voltages applied to, for example, the memory block BLK of FIG. 2. The timing diagram of FIG. 3 may show a data read operation process stored in, for example, the memory block BLK.

Referring to FIGS. 2 and 3, all signals that are shown may start from a low state. A non-select bit line BL_unsel and the common source line CSL may be in the low state during a whole time shown in the timing diagram. The low state may be, for example, 0 V or a voltage close to 0 V. The low state may mean, for example, a turn-off voltage. Hereinafter, the turn-off voltage may mean a voltage lower than a threshold voltage of each cell or transistor, and a turn-on voltage may mean a voltage higher than the threshold voltage of each cell or transistor.

At a first time t1, voltages of the string select line SSL, the dummy word line DWL, and the gate select line GSL may be increased. A turn-on voltage of the string select transistor SST may be applied to the string select lines SSL. A turn-on voltage of the dummy cell DMC may be applied to the dummy word line DWL. A turn-on voltage of the gate select transistor GST may be applied to the ground select line GSL.

At a second time t2, voltages of the non-select word lines WL_unsel and the select word line WL_sel may be increased. The pass voltage V_pass may be applied to the non-select word lines WL_unsel. The read voltage V_read may be applied to the select word line WL_sel. In an example embodiment, the pass voltage V_pass may be higher than or equal to the read voltage V_read.

At the second time t2, because a voltage is applied via the string select line SSL, the string select transistor SST is in a turn-on state, and the select bit line BL_sel is in a ground state, a channel of the string select transistor SST may not be boosted in a cell string. At the second time t2, because a voltage is applied via the ground select line GSL, the ground select transistor GST is in a turn-on state, and the common source line CSL is in a ground state, a channel of the ground select transistor GST may not be boosted in the cell string.

At a third time t3, the dummy word line DWL may be switched to a turn off voltage. The dummy cell DMC may be turned off through switching of the dummy word lines DWL.

From a fourth time t4 to a sixth time t6, a pre-charge operation may be performed on the select bit lines BL_sel. A section from the fourth time t4 to the sixth time t6 may be defined as a pre-charge section PRC (i.e., period/time segment) of the timing diagram. Specifically, at the fourth time t4, a pre-charge voltage V_pre may be applied to the select bit lines BL_sel and then the select bit line BL_sel may float in the pre-charge section PRC of the timing diagram.

In the pre-charge section PRC of the timing diagram, since the dummy cell DMC remains in the turn-off state, a cell string connected to the select bit line BL_sel may be isolated from the common source line CSL that is in the ground state. In the pre-charge section PRC of the timing diagram, a voltage of the select bit line BL_sel may substantially remain at a level of the pre-charge voltage V_pre. Unnecessary energy dissipation may be prevented through isolation of the cell string and the common source line CSL in the pre-charge section PRC of the timing diagram. In a memory cell array 110 with multiple cell strings STR_1 to STR_n, multiple of the cell strings STR_1 to STR_n may be isolated from the common source line CSL when the respective dummy cells (DMC) are in the turn-off state.

After the pre-charge operation is performed, a read operation on the memory block BLK may be performed. Specifically, at the sixth time t6, the dummy cell DMC may be turned on by applying a turn on voltage of the dummy cell DMC to the dummy word line DWL. When the dummy cell DMC is turned on, and a read voltage V_read applied to the select word line WL_sel is lower than a threshold voltage of a memory cell connected to the select word line WL_sel, the memory cell may be turned off. Thus, a voltage of the select bit line BL_sel connected to a cell string included in the memory cell may be continuously maintained (in case of Read_1). When the dummy cell DMC is turned on, and the read voltage V_read applied to the select word line WL_sel is higher than the threshold voltage of the memory cell connected to the select word line WL_sel, the memory cell may be turned on. Thus, since current may flow into the cell string included in the memory cell, at least a part of the voltage of the select bit line BL_sel connected to the cell string may be dissipated (in case of Read_2). Dissipation of the voltage of the select bit line BL_sel and a dissipation degree may be amplified through, for example, a sense amplifier, and be used as an index for determining data stored in the memory cell.

Figure 4A:
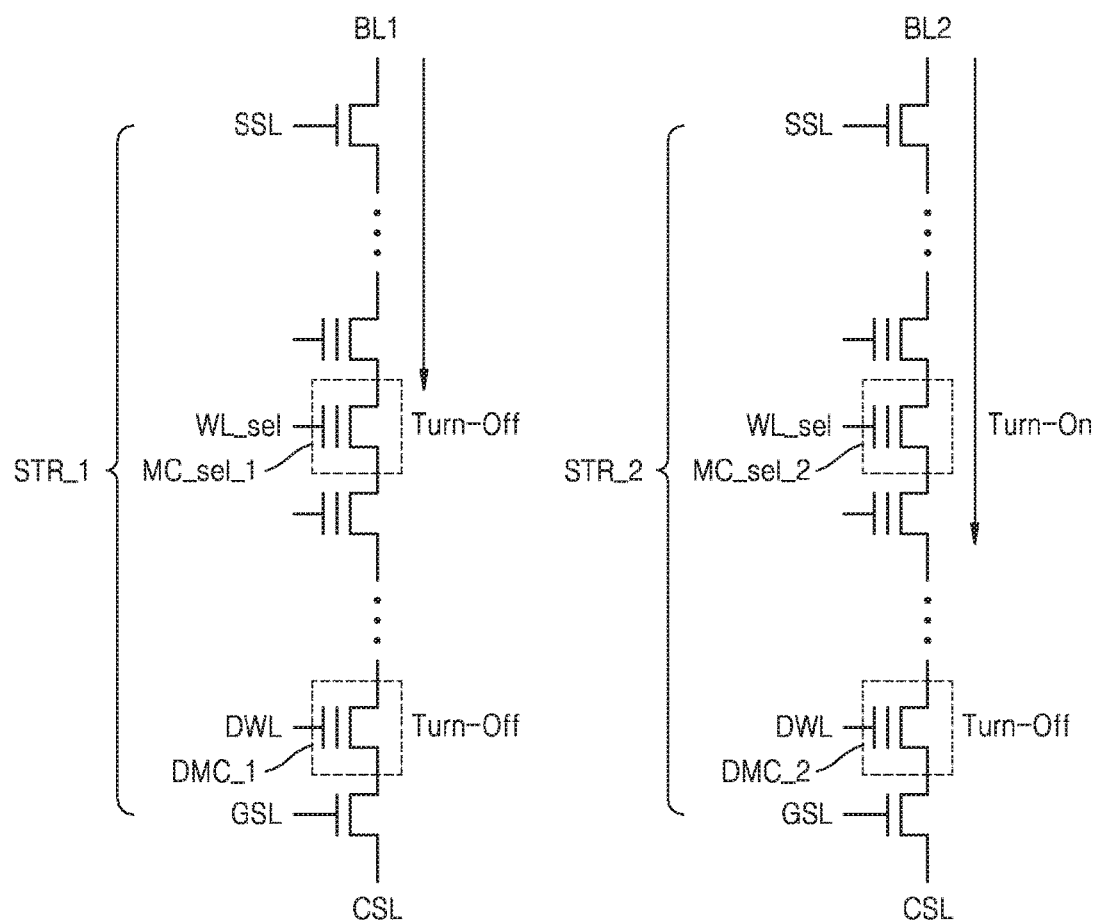
FIG. 4A shows cell strings respectively connected to select bit lines in a pre-charge period (time segment).
Figure 4B:
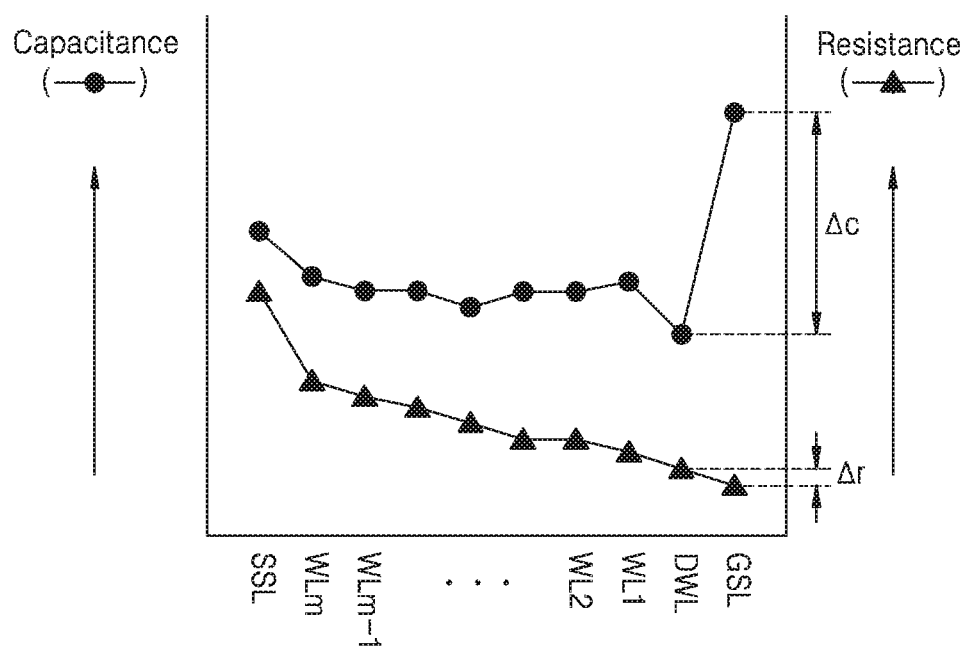
FIG. 4B is a comparison graph of capacitance and resistance values between lines included in cell strings.
Figure 4C:
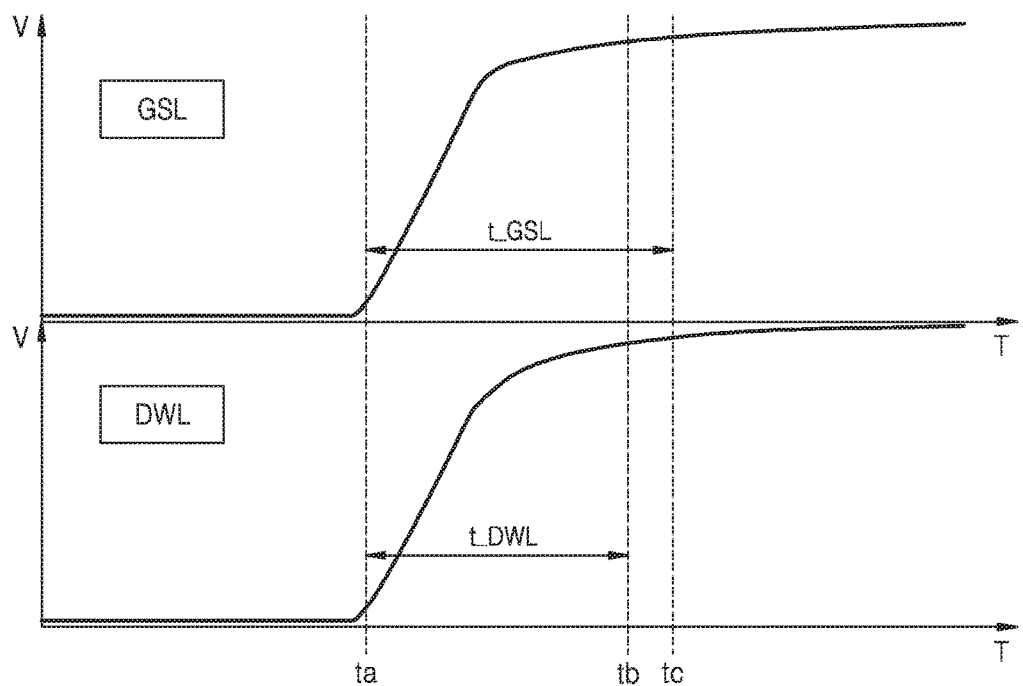
FIG. 4C is a comparison graph of a switching time between a dummy word line and a ground select line according to an example embodiment.

FIG. 4A shows first and second cell strings STR_1 and STR_2 respectively connected to select bit lines in the pre-charge section PRC of the timing diagram. FIG. 4B is a comparison graph of capacitance and resistance values between lines included in the first and second cell strings STR_1 and STR_2. FIG. 4C is a comparison graph of a switching time between the dummy word line DWL and the ground select line GSL according to an example embodiment.

Referring to FIG. 4A, the first and second cell strings STR_1 and STR_2 may be respectively connected between the first bit line BL1 and the common source line CSL and between the second bit line BL2 and the common source line CSL in the pre-charge section PRC of the timing diagram (FIG. 3).

Voltages of the first and second bit lines BL1 and BL2 may be the pre-charge voltage V_pre. A voltage of the common source line CSL may be a ground voltage.

The first cell string STR_1 may include a first select cell MC_sel_1 connected to the select word line WL_sel and a first dummy cell DMC_1 connected to the dummy word line DWL. A voltage of the select word line WL_sel may be the read voltage V_read. A voltage of the dummy word line DWL may be a turn off voltage. In an example embodiment, a threshold voltage of the first select cell MC_sel_1 may be higher than the read voltage V_read.

The second cell string STR_2 may include a second select cell MC_sel_2 connected to the select word line WL_sel and a second dummy cell DMC_2 connected to the dummy word line DWL. In an example embodiment, a threshold voltage of the second select cell MC_sel_2 may be lower than the read voltage V_read.

In an example embodiment, the first and second dummy cells DMC _1 and DMC of the first and second cell strings STR_1 and STR_2 may be in a turn off state in the pre-charge section PRC of the timing diagram. Thus, irrespective of a program state of each of the first and second select cells MC_sel_1 and MC_sel_2 connected to the select word line WL_sel, a current flow to the common source line CSL may be prevented, and thus energy dissipation may be blocked.

Referring to FIG. 4B, the ground select line GSL, the dummy word line DWL, the word lines WL1~WLm, and the string select lines SSL that are connected to the first and second cell strings STR_1 and STR_2 may have different capacitance and resistance values. In the graph of FIG. 4B, capacitance and resistance values may increase in an arrow direction.

In the graph, capacitance and resistance values of the dummy word line DWL and the ground select line GSL may be compared. Specifically, the capacitance of the ground select line GSL may be greater than the capacitance of the dummy word line DWL by Δc, and the resistance value of the ground select line GSL may be less than the resistance value of the dummy word line DWL by Δr. In an example embodiment, a value Δc may be greater than that of Δr.

When the value of Δc is greater than that of Δr, a time constant of the dummy word line DWL may be less than that of a time constant of the ground select line GSL. Specifically, a product of multiplication of the capacitance and the resistance value of the dummy word line DWL may be less than that of a product of multiplication of the capacitance and the resistance value of the ground select line GSL. Thus, voltage switching of the dummy word line DWL may be faster than that of the ground select line GSL.

Referring to FIG. 4C, a voltage switching time of the ground select line GSL and the dummy word line DWL may be measured. A switching time may be 4 times of a time constant, in other words, a time arriving at 98% of a target voltage. The x-axis may denote time T, and the y-axis may denote voltage V in the graph.

The ground select line GSL and the dummy word line DWL may be simultaneously switched at a time ta. The ground select line GSL and the dummy word line DWL may be switched, for example, from a turn off voltage to a turn on voltage.

The dummy word line DWL may arrive at the target voltage at a time ta. The ground select line GSL may arrive at the target voltage at a time tc later than the time tb. In other words, a switching time t_DWL of the dummy word line DWL may be shorter than a switching time t_GSL of the ground select line GSL. The dummy cell DMC connected to the dummy word line DWL may have a faster turn on and/or off time than that of the ground select transistor GST connected to the ground select line GSL.

According to an example embodiment, before a pre-charge period (time segment) of each cell string or in a pre-charge period (time segment), connection to the common source line CSL may be controlled by turning the dummy cell DMC on and/or off. As a result, a memory device having an enhanced operating speed may be provided. Also, current consumption may be reduced by turning the dummy cell DMC having a relatively small time constant on and/or off.

Figure 5:
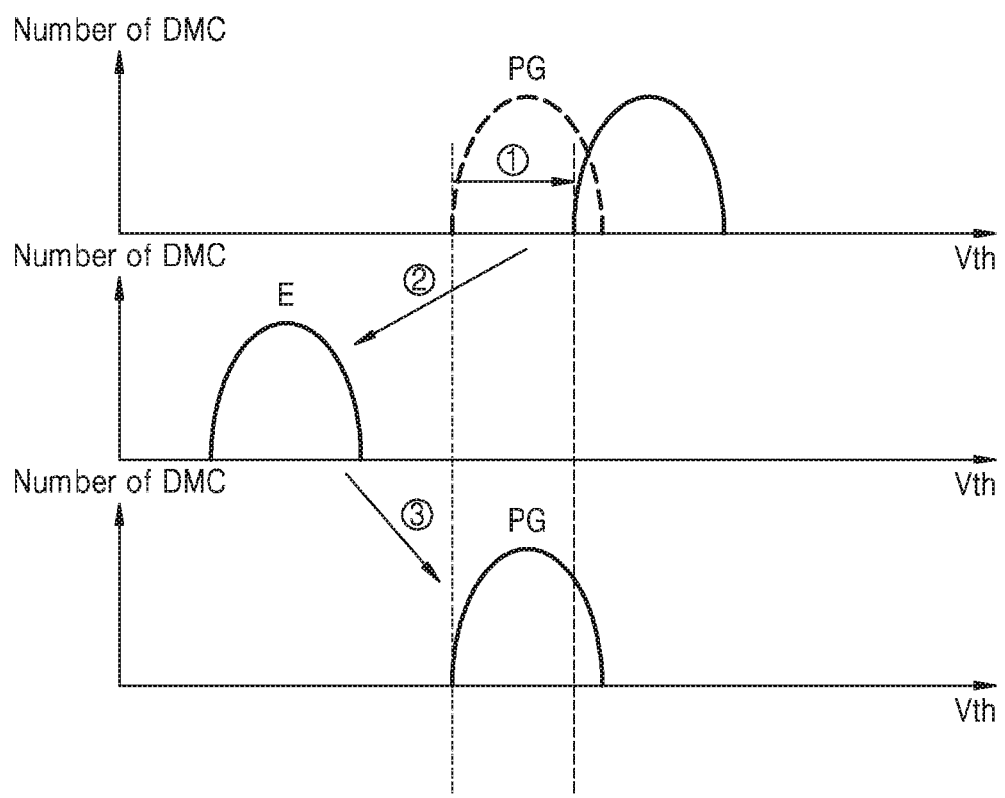
FIG. 5 is a graph for explaining an example of a process of setting a threshold voltage of a dummy cell according to an example embodiment.

FIG. 5 is a graph for explaining an example of a process of setting a threshold voltage Vth of the dummy cell DMC according to an example embodiment. The process of setting the threshold voltage of FIG. 5 may be performed by the memory device 100 of FIG. 1.

Referring to FIG. 5, the graph shows distributions of the dummy cells DMC with respect to threshold voltages Vth. In the graph, the horizontal axis may denote the threshold voltage Vth and the vertical axis may denote the number of dummy cells DMC. When the dummy cell DMC is a 1 bit single level cell (SLC) programmed in 1 bit, the dummy cell DMC may have one of an erasure state E and a program state PG. However, the dummy cell DMC is not limited thereto. The dummy cell DMC may be implemented as a multi level cell (MLC) programmed in 2 bits or a triple level cell (TLC) programmed in 3 bits, etc.

In an example embodiment, the dummy cells DMC may initially have a distribution indicated by a dashed line in the program state PG. Thereafter, a distribution of the dummy cells DMC may be moved by an external shock and/or abrasion, etc. in a direction in which the threshold voltage Vth gradually increases. (①). For example, the dummy cell control logic 122 may, when executed, sense the threshold voltage Vth of the dummy cell DMC during a certain period to determine whether the threshold voltage Vth has exceeded a certain value. When the dummy cell control logic 122 determines that the threshold voltage Vth has exceeded the certain value, the dummy cell control logic 122 may, when executed, reset the threshold voltage Vth of the dummy cell DMC. Specifically, the dummy cell control logic 122 may, when executed, control the dummy cell DMC to be in the erasure state E (②) and then in the program state PG (③). The dummy cells DMC may be erased and then programmed again so that the distribution of the dummy cells DMC may be moved to an initial distribution or in a direction in which the threshold voltage Vth is reduced.

Figure 6:
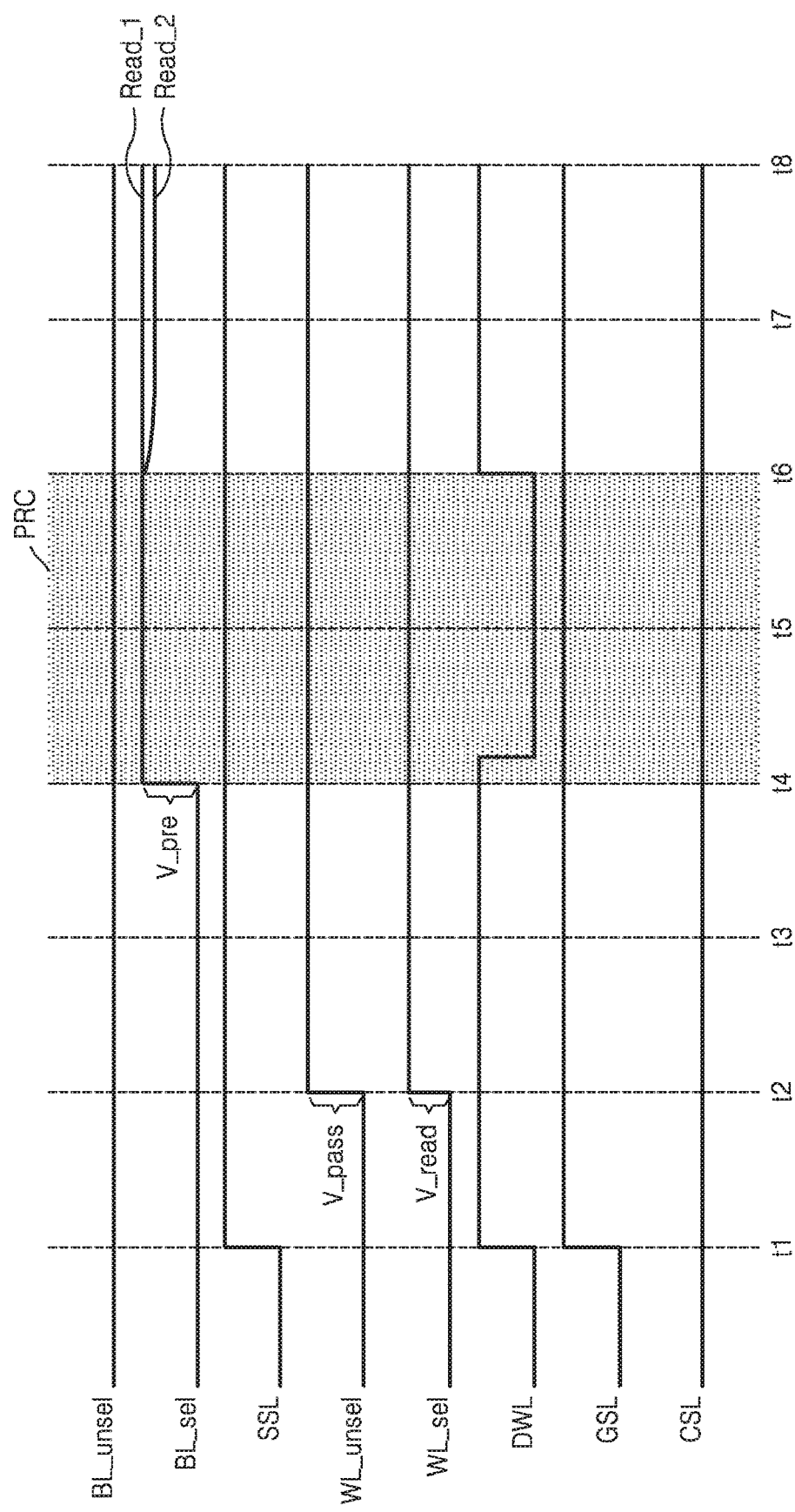
FIG. 6 is a timing diagram of operations of various signals according to another example embodiment.

FIG. 6 is a timing diagram of operations of various signals according to another example embodiment.

The timing diagram of FIG. 6 may be similar to the timing diagram of FIG. 3, except that the dummy word line DWL is switched from a turn on voltage to a turn off voltage in the pre-charge section PRC of the timing diagram. Specifically, the pre-charge voltage V_pre may be applied to the select bit line BL_sel at the fourth time t4, and then the turn off voltage may be applied to the dummy word line DWL to which the turn on voltage has been applied.

Figure 7:
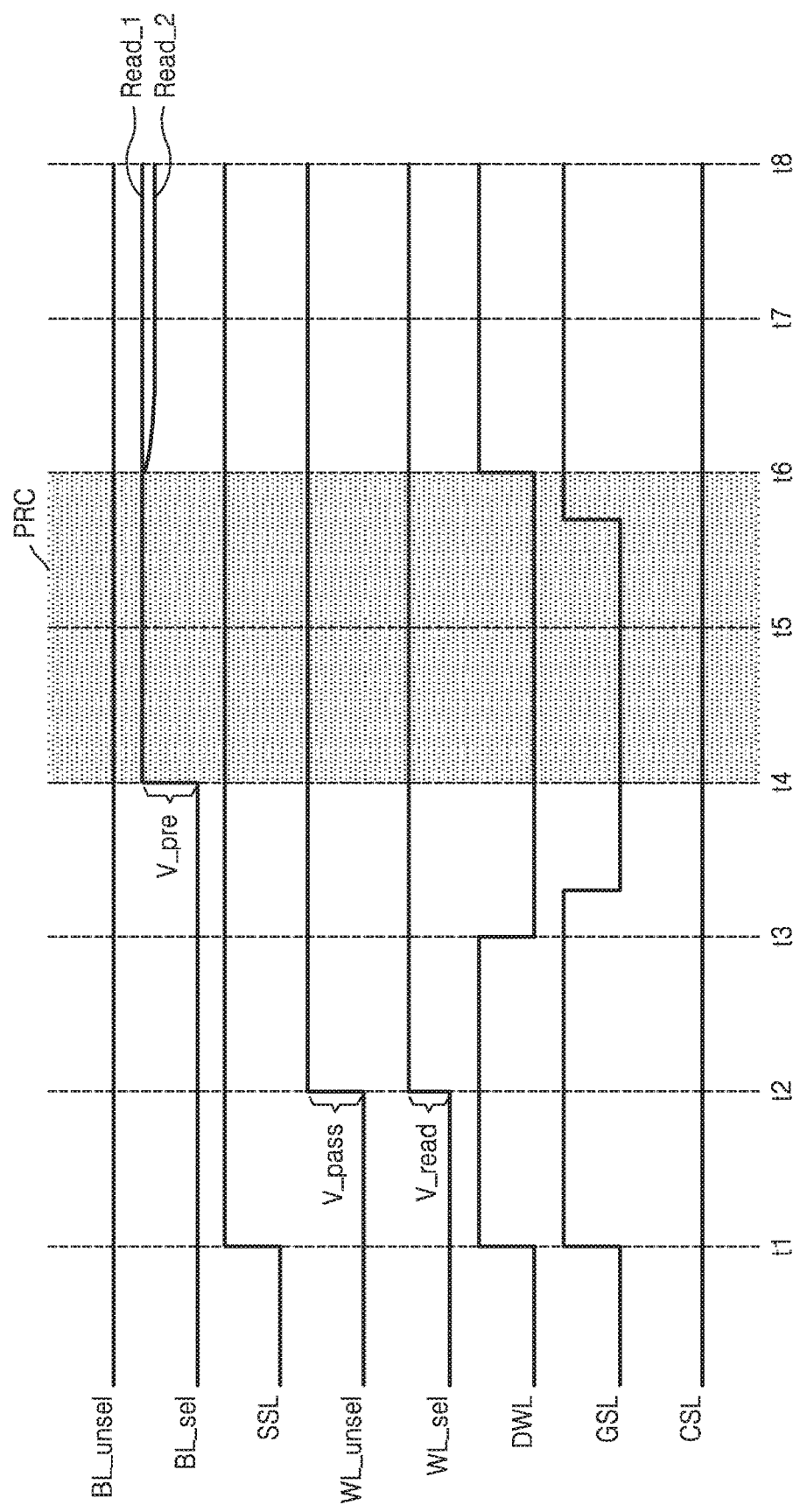
FIG. 7 is a timing diagram of operations of various signals according to another example embodiment.

FIG. 7 is a timing diagram of operations of various signals according to another example embodiment.

The timing diagram of FIG. 7 may be similar to the timing diagram of FIG. 3, except that a turn off voltage is applied to the ground select line GSL in at least a part of the pre-charge section PRC of the timing diagram. In an example embodiment, after the dummy word line DWL is switched to a turn off voltage and before the pre-charge voltage V_pre is applied to the select bit line BL_sel at the third time t3, the turn off voltage may be applied to the ground select line GSL to which the turn on voltage has been applied.

In an example embodiment, the ground select line GSL may be switched from the turn off voltage to the turn on voltage in the pre-charge section PRC of the timing diagram before or simultaneously the dummy word line DWL is switched from the turn off voltage to the turn on voltage. A voltage of the ground select line GSL may be controlled by or using, for example, the select transistor control logic 124 of FIG. 1. The turn off voltage may be applied to the ground select line GSL in at least a part of the pre-charge section PRC of the timing diagram, and thus power efficiency may be improved.

Figure 8:
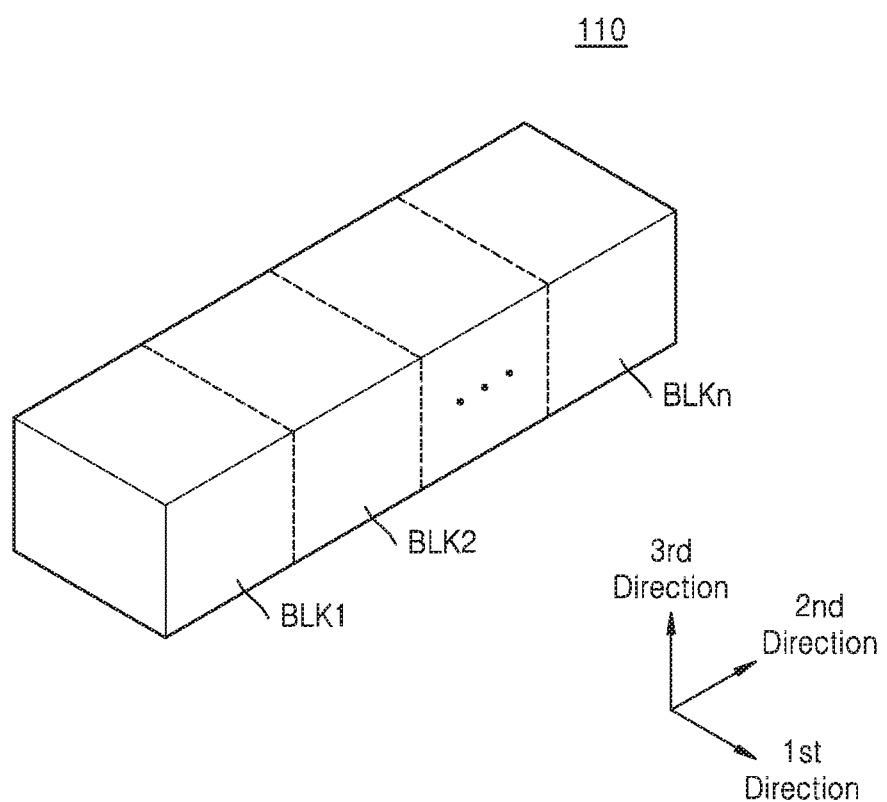
FIG. 8 is a block diagram showing another example of a memory cell array of the memory device of FIG. 1.

FIG. 8 is a block diagram showing another example of the memory cell array 110 of the memory device of FIG. 1. Referring to FIGS. 1 and 8, the memory cell array 110 may include multiple memory blocks BLK1~BLKz. Each of the memory blocks BLK1~BLKz may have a three-dimensional structure (or a vertical structure). Specifically, each of the memory blocks BLK1~BLKz may include structures extending along first through third directions. For example, each of the memory blocks BLK1~BLKz may include multiple cell strings extending along the third direction. The cell strings may be spaced by a specific distance along the first and second directions.

The memory blocks BLK1~BLKz may be selected by the row decoder 140. For example, the row decoder 140 may select a memory block corresponding to a memory block address from among the memory blocks BLK1~BLKz. Program, read, or erasure operations may be performed by the selected memory block.

Figure 9:
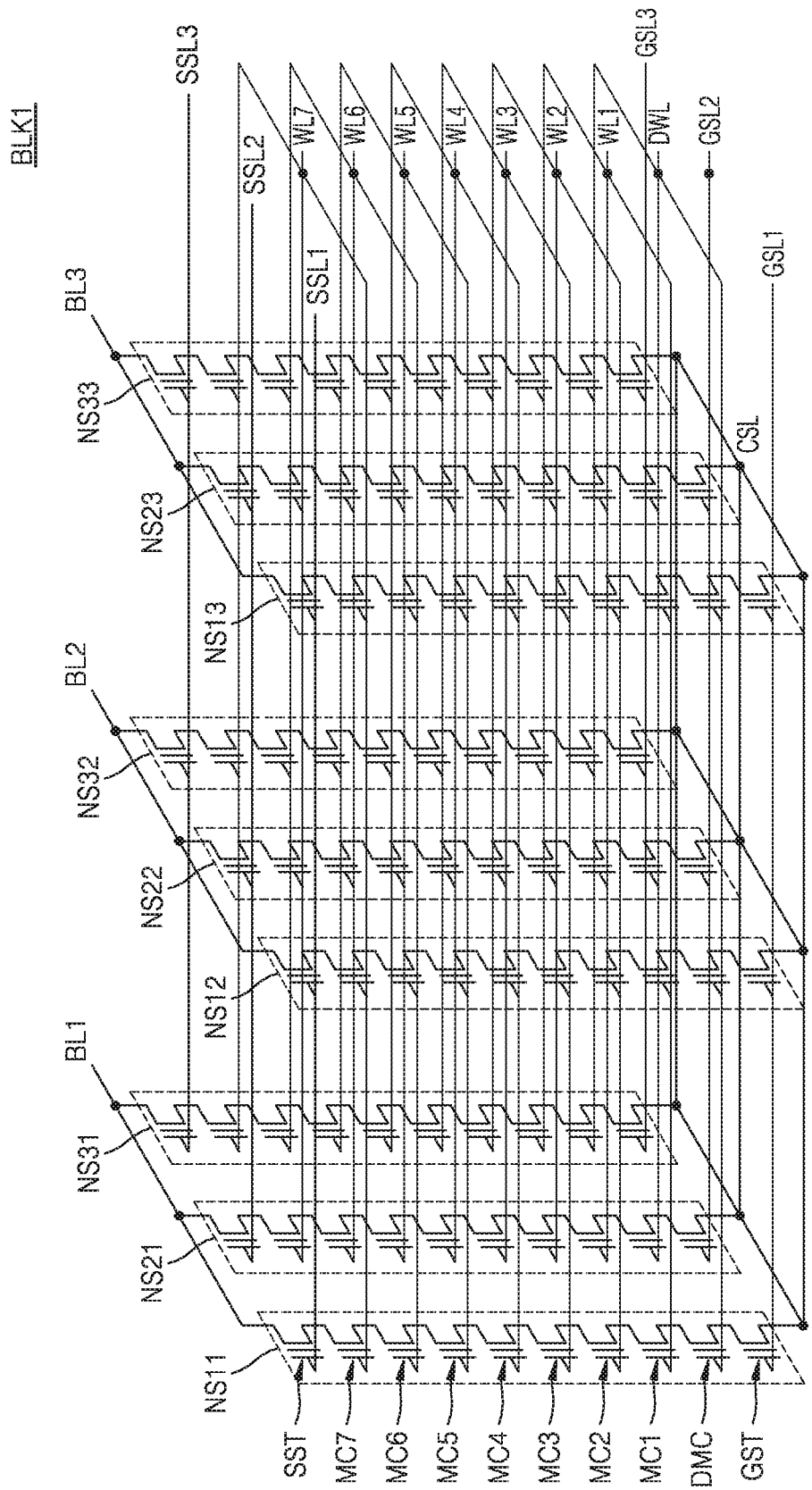
FIG. 9 is a circuit diagram of an example of an equivalent circuit of a first block among memory blocks of the memory cell array of FIG. 8.

FIG. 9 is a circuit diagram of an example of an equivalent circuit of a first block BLK1 among the memory blocks BLK1~BLKz of the memory cell array of FIG. 8.

Referring to FIG. 9, the first block BLK1 may be a NAND flash memory of a vertical structure with NAND cells. Each of the memory blocks BLK1~BLKz shown in FIG. 8 may be implemented as shown in FIG. 9. The first block BLK1 may include multiple NAND strings NS11~NS33, multiple word lines WL1~WL7, multiple bit lines BL1~BL3, multiple ground select lines GSL1~GSL3, multiple string select lines SS1~SSL3, the dummy word line DWL, and the common source line CSL. In this regard, the number of the NAND strings NS11~NS33, the number of the word lines WL1~WL7, the number of the bit lines BL1~BL3, the number of the ground select lines GSL1~GSL3, and the number of the string select lines SS1~SSL3 may be changed in various ways according to example embodiments.

The NAND strings NS11, NS21, NS31 may be provided between the first bit line BL1 and the common source line CSL. The NAND strings NS12, NS22, NS32 may be provided between the second bit line BL2 and the common source line CSL. The NAND strings NS13, NS23, NS33 may be provided between the third bit line BL3 and the common source line CSL. Each (for example, NS11) of the NAND strings NS11, NS21, NS31, NS12, NS22, NS32, NS13, NS23, NS33 may include the string select transistor SST, the memory cells MC1~MC7, the dummy cell DMC, and the ground select transistor GST that are serially connected to each other.

NAND strings commonly connected to one bit line may configure one column. For example, the NAND strings NS11, NS21, NS31 commonly connected to the first bit line BL1 may correspond to a first column, the NAND strings NS12, NS22, NS32 commonly connected to the second bit line BL2 may correspond to a second column, and the NAND strings NS13, NS23, NS33 commonly connected to the third bit line BL3 may correspond to a third column.

NAND strings commonly connected to one string select line may configure one row. For example, the NAND strings NS11, NS21, NS31 commonly connected to the first string select line SSL1 may correspond to a first row. The NAND strings NS12, NS22, NS32 commonly connected to the second string select line SSL2 may correspond to a second row. The NAND strings NS13, NS23, NS33 commonly connected to the third string select line SSL3 may correspond to a third row.

The string select transistor SST may be connected to the corresponding string select lines SSL1 through SSL3. The memory cells MC1~MC7 may be connected to the respective corresponding word lines WL1~WL7. The dummy cells DMC may be connected to the dummy word line DWL. The ground select transistor GST may be connected to the corresponding ground select lines GSL1~GSL3. The string select transistor SST may be connected to the corresponding bit lines BL1~BL3. The ground select transistor GST may be connected to the common source line CSL.

In the present example embodiment, a word line (for example, WL1) of the same height may be commonly connected. The string select lines SSL1~SSL3 may be separated from each other. The ground select lines GSL1~GSL3 may be separated from each other. For example, when memory cells connected to the first word line WL1 and included in the NAND strings NS11, NS12, NS13 corresponding to the first column are programmed, the first word line WL1 and the first string select line SSL1 may be selected. However, the word line, string select lines and ground select lines are not limited thereto. In another example embodiment, the ground select lines GSL1~GSL3 may be commonly connected.

Figure 10:
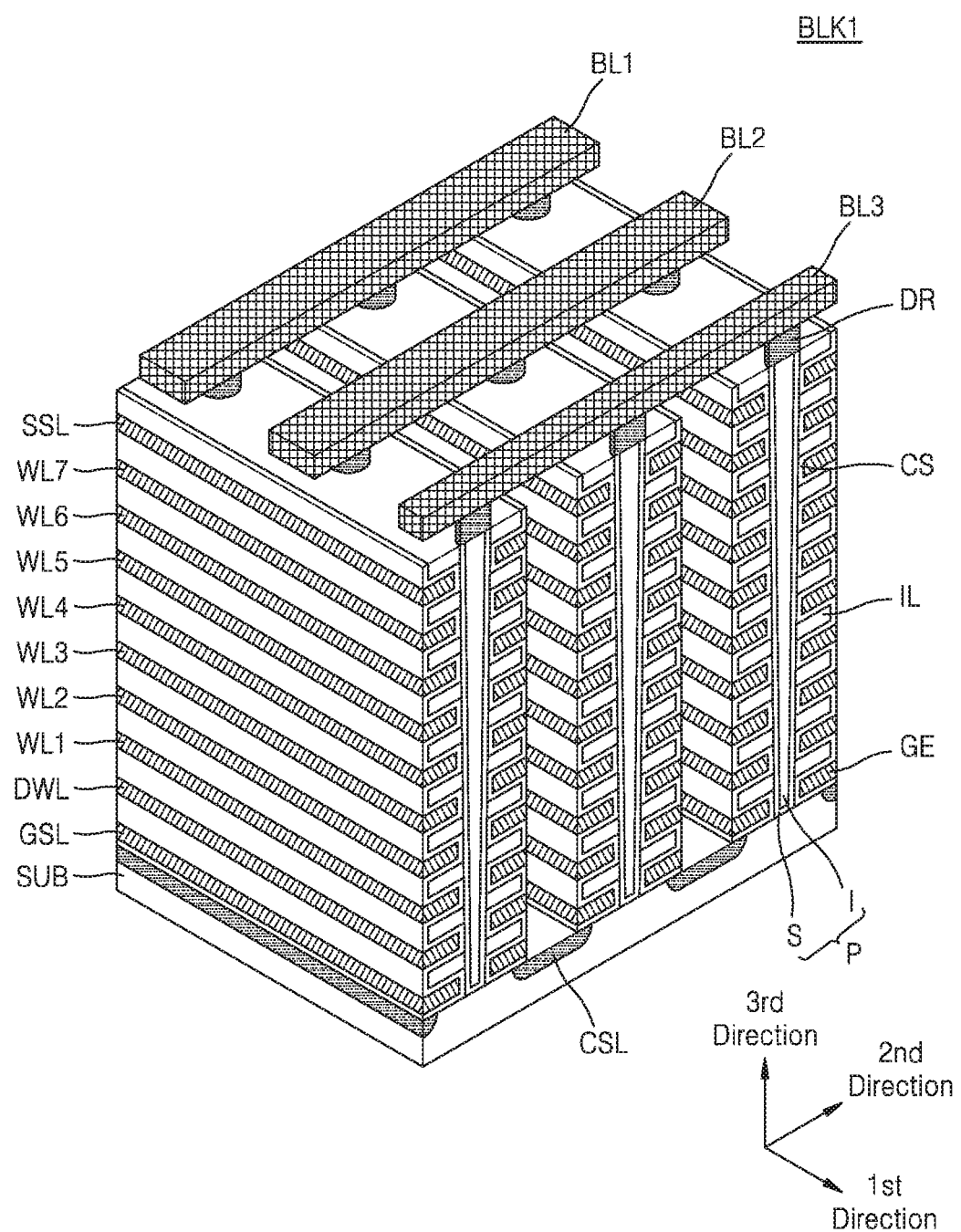
FIG. 10 is a perspective view of an example of a first block among memory blocks of the memory cell array of FIG. 8.

FIG. 10 is a perspective view of an example of the first block BLK1 among memory blocks of the memory cell array of FIG. 8.

Referring to FIG. 10, the first block BLK1 may be formed in a perpendicular direction with respect to a substrate SUB. In FIG. 10, the first block BLK1 includes one ground select line GSL, one dummy word line DWL, seven word lines WL1~WL7, one string select line SSL, and three bit lines BL1~BL3 in FIG. 10. However, the number of the ground select lines GSL, the number of the dummy word lines DWL, the number of the word lines WL, the number of the string select lines SSL, and the number of the bit lines BL may be changed in various ways according to embodiments.

The substrate SUB may have a first conductive type (for example, a p type). The common source line CSL extending in a first direction and doped with second conductive type (for example, an n type) impurities may be provided on the substrate SUB. On a region of the substrate SUB between the adjacent two common source lines CSL, multiple insulating layers IL extending the first direction may be sequentially provided in a third direction and may be spaced by a specific distance along the third direction. For example, the multiple insulating layers IL may include an insulating material such as silicon oxide.

On the region of the substrate SUB between the adjacent two common source lines CSL, multiple pillars P sequentially arranged in the first direction and penetrating into the insulating layers IL in the third direction may be provided. For example, the pillars P may penetrate into the insulating layers IL and may be in contact with the substrate SUB. Specifically, a surface layer S of each of the pillars P may include a first type silicon material and may function as a channel region. An inner layer I of each of the pillars P may include an insulating material such as silicon oxide or an air gap.

In the region of the substrate SUB between the adjacent two common source lines CSL, a charge storage layer CS may be provided along exposed surfaces of the insulating layers IL, the pillars P, and the substrate SUB. The charge storage layer CS may include a gate insulating layer (or referred to as a 'tunneling insulating layer'), a charge trap layer, and a blocking insulating layer. For example, the charge storage layer CS may have an oxide-nitride-oxide (ONO) structure. Also, in the region of the substrate SUB between the adjacent two common source lines CSL, on the exposed surface of the charge storage layer CS, a gate electrode GE such as the select lines GSL and SSL and the word lines WL1 through WL9 may be provided.

Drains or drain contacts DR may be provided on the pillars P. For example, the drains or drain contacts DR may include a silicon material doped with second conductive type impurities. On the drains DR, the bit lines BL1 through BL3 extending in the second direction and spaced by a specific distance in the first direction may be provided.

Figure 11:
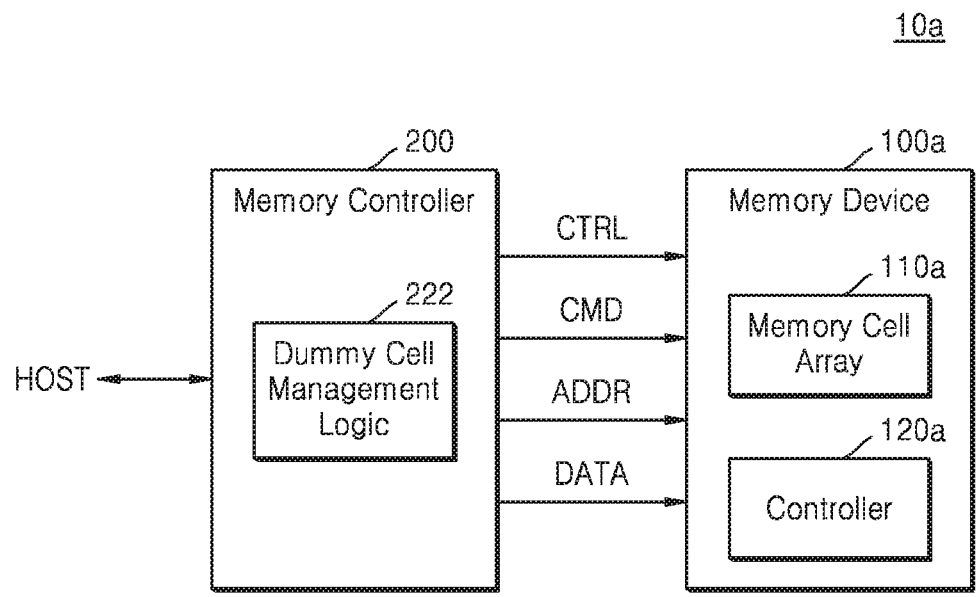
FIG. 11 is a block diagram of a memory system according to an example embodiment.

FIG. 11 is a block diagram of a memory system 10a according to an example embodiment.

Referring to FIG. 11, the memory system 10a may include a memory device 100a and a memory controller 200 including a dummy cell management logic 222. The memory device 100a may be implemented, for example, substantially similar to the memory device 100 of FIG. 1.

The memory controller 200 may control the memory device 100a to read data stored in the memory device 100a or write the data onto the memory device 100a in response to read/write requests of a host HOST. Specifically, the memory controller 200 may provide the address ADDR, the command CMD, and the control signal CTRL to the memory device 100a, thereby controlling program, read, and erasure operations on the memory device 100a. Also, the data DATA for the program operation and the read data DATA may be transmitted and received between the memory controller 200 and the memory device 100a.

Although not shown, the memory controller 200 may include RAM, a processing unit, a host interface, and a memory interface. The RAM may be used as an operation memory of the processing unit. The processing unit may control an operation of the memory controller 200. The host interface may include a protocol for perform a data exchange between the host HOST and the memory controller 200. For example, the memory controller 200 may be configured to communicate with the host HOST through at least one of various interface protocols such as USB, MMC, PCI-E, ATA (Advanced Technology Attachment), Serial-ATA, Parallel-ATA, SCSI, ESDI, IDE (Integrated Drive Electronics), etc.

The dummy cell management logic 222 may manage threshold voltage levels of dummy cells included in the memory cell array 110a. In an example embodiment, the dummy cell management logic 222 may sense a threshold voltage of a dummy cell in an idle time to determine whether the threshold voltage has exceeded a certain value. In this case, the memory controller 200 may transmit a control signal for sensing the threshold voltage of the dummy cell to the memory device 100a through the command CMD, the address ADDR, the data DATA, or the control single CTRL.

In an example embodiment, when the dummy cell management logic 222 determines that a threshold voltage of at least one of the dummy cells included in the memory cell array 110a has exceeded a certain value, the dummy cell management logic 222 may reset the threshold voltage of the dummy cell. In an example embodiment, the dummy cell management logic 222 may transmit a signal controlling the dummy cell to be erased and then programmed again to the memory system 10a through the command CMD, the address ADDR, the data DATA, or the control single CTRL.

Figure 12:
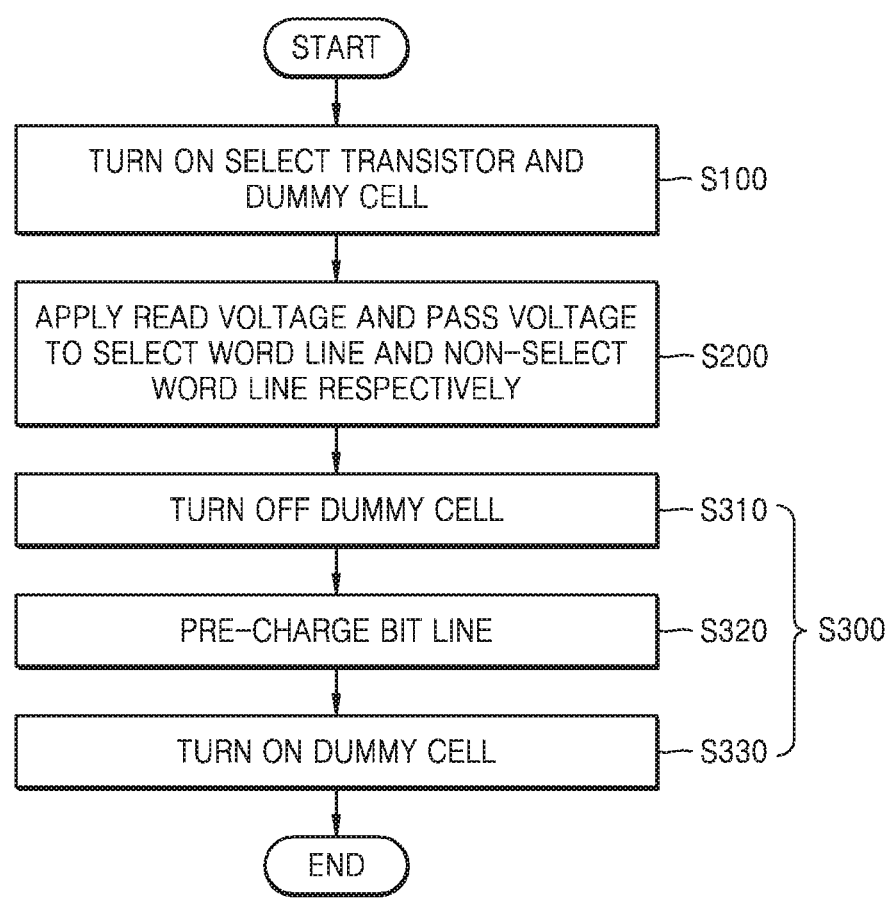
FIG. 12 is a flowchart of operations of a memory device according to an example embodiment.

FIG. 12 is a flowchart of operations of a memory device according to an example embodiment. The flowchart of FIG. 12 may be a flowchart of operations of, for example, the memory device 100 of FIG. 1.

Referring to FIG. 12, a select transistor and the dummy cell DMC may be turned on (operation S100). The select transistor may include, for example, the string select transistor SST and the ground select transistor GST.

After the select transistor and the dummy cell DMC are turned on, the read voltage V_read and the pass voltage V_pass may be respectively applied to the select word lines WL_sel and the non-select word line WL_unsel (operation S200). In an example embodiment, the pass voltage V_pass may be higher than or equal to the read voltage V_read.

After the read voltage V_read and the pass voltage V_pass are respectively applied to the select word lines WL_sel and the non-select word line WL_unsel, dummy cell DMC turn off, bit line pre-charge, and dummy cell DMC turn on operations may be sequentially performed (operation S300). The dummy cell DMC may be turned off before a pre-charge operation is performed on the bit lines BL (operation S310). A turn off voltage may be applied to the dummy cell DMC under control of or using, for example, the dummy cell control logic 122.

After the dummy cell DMC is turned off, the pre-charge operation may be performed on the bit lines BL (operation S320). For example, the pre-charge operation may be performed on the select bit lines BL_sel among the bit lines BL. The pre-charge operation may be performed by, for example, the page buffer 150, by applying the pre-charge voltage V_pre to the select bit lines BL_sel. In an example embodiment, the dummy cell DMC may maintain a turn off state in at least a part of a pre-charge period (time segment). In an example embodiment, the ground select transistor GST may maintain a turn on state in the pre-charge period (time segment).

After the pre-charge operation is performed on the bit lines BL, the dummy cell DMC may be turned on (operation S330). A turn off voltage may be applied to the dummy cell DMC under control of or using, for example, the dummy cell control logic 122. In an example embodiment, a switching speed of the dummy cell DMC may be faster than a switching speed of the ground select transistor GST. After the dummy cell DMC is turned on, a read operation may be performed on cell strings connected to the bit lines BL on which the pre-charge operation is performed.

Figure 13:
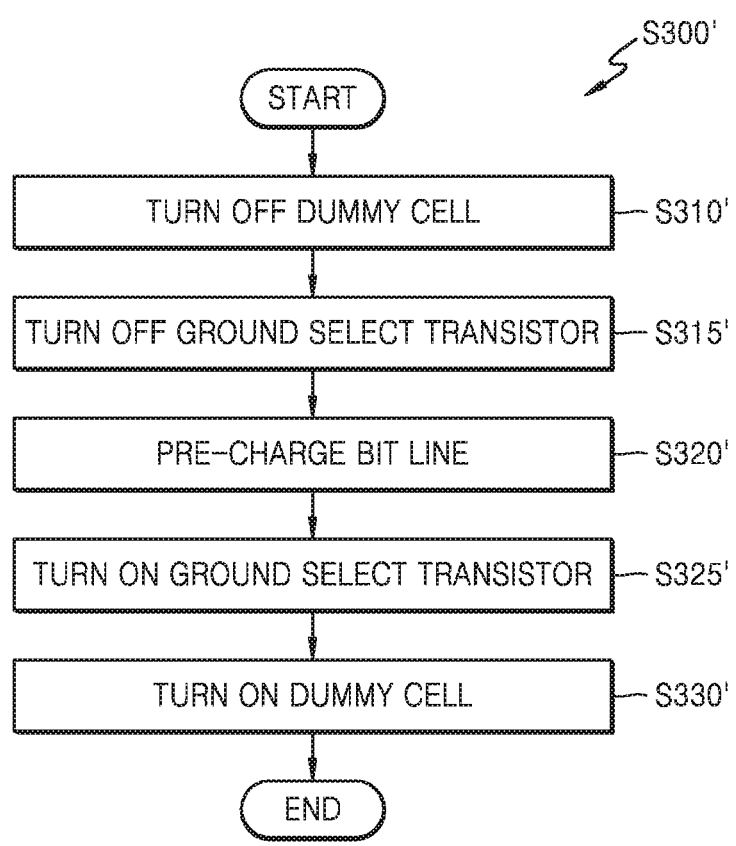
FIG. 13 is a flowchart of operations of a memory device according to another example embodiment.

FIG. 13 is a flowchart of operations of a memory device according to another example embodiment. Operations S300' of FIG. 13 may be another example embodiment of, for example, operation S300 of sequentially performing the dummy cell DMC turn off, bit line pre-charge, and dummy cell DMC turn on operations of FIG. 12.

Referring to FIG. 13, the dummy cell DMC may be turned off (operation S310') before a pre-charge operation is performed on the bit lines BL, and then the ground select transistor GST may be turned off (operation S315'). A turn off voltage may be applied to the ground select transistor GST under control of or using, for example, the select transistor control logic 124.

After the ground select transistor GST is turned off (operation S315') and the pre-charge operation is performed on the bit lines BL (operation S320'), the ground select transistor GST may be turned on (operation S325'). In an example embodiment, since the dummy cell DMC is still in a turn off state when the ground select transistor GST is turned on, cell strings connected to the bit lines BL on which the pre-charge operation is performed and the common source line CSL may be in an isolation state. After the ground select transistor GST is turned on, the dummy cell DMC may be turned on (operation S330'). After the dummy cell DMC is turned on, a read operation may be performed on the cell strings connected to the bit lines BL on which the pre-charge operation is performed.

Figure 14:
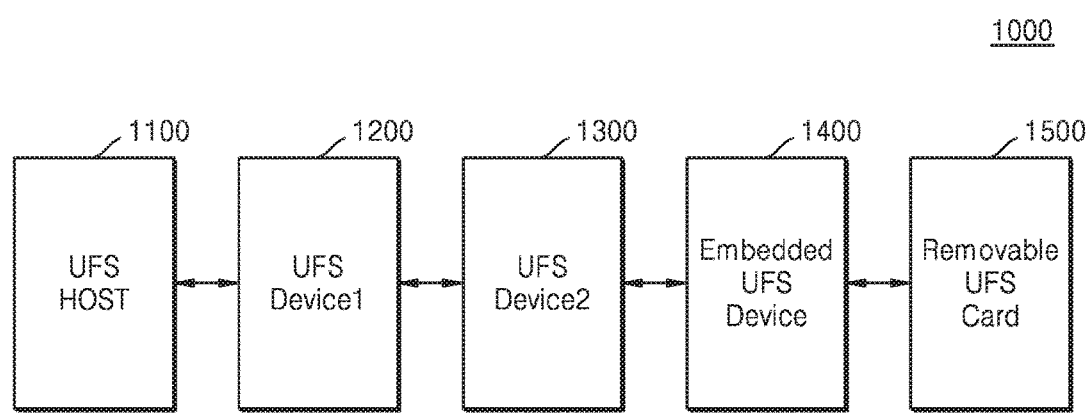
FIG. 14 is a block diagram of an example of a memory device applied as a universal flash storage (UFS) system according to example embodiments.

FIG. 14 is a block diagram of an example of a memory device applied as a universal flash storage (UFS) system 1000 according to example embodiments.

Referring to FIG. 14, the UFS system 10000 may include a UFS host 1100, UFS devices 1200 and 1300, an embedded UFS device 1400, and a detachable UFS card 1500. The UFS host 1100 may be an application processor of a mobile device. The UFS host 1100, the UFS devices 1200 and 1300, the embedded UFS device 1400, and the detachable UFS card 1500 may communicate with external devices via respective UFS protocols. At least one of the UFS devices 1200 and 1300, the embedded UFS device 1400, and the detachable UFS card 1500 may include the memory device 100 of FIGS. 1 through 11.

A memory card, a non-volatile memory device, and a card controller according to the present disclosure may be mounted by using various types of packages. For example, the non-volatile memory device and/or the card controller may be mounted by using packages, such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), etc.

While the inventive concepts described herein have been particularly shown and described with reference to embodiments thereof, it will be understood that various changes in form and details may be made therein without departing from the spirit and scope of the following claims.

What is claimed is:

1. A non-volatile memory device, comprising:
a cell string comprising at least one memory cell, a ground select transistor, and at least one dummy cell between the at least one memory cell and the ground select transistor and connected to a bit line; and
a controller that executes dummy cell control logic configured to control a gate voltage of the at least one dummy cell to be lower than a threshold voltage of the at least one dummy cell in at least a part of a pre-charge period,
wherein the dummy cell control logic controls the gate voltage of the at least one dummy cell to switch between a turn on voltage and a turn off voltage of the at least one dummy cell at least once in the pre-charge period.

2. The non-volatile memory device according to claim 1, further comprising:
a page buffer connected to the bit line,
wherein the page buffer applies a pre-charge voltage to the bit line in the pre-charge period.

3. The non-volatile memory device according to claim 1, wherein the dummy cell control logic controls the gate voltage of the at least one dummy cell to be lower than the threshold voltage of the at least one dummy cell before a start of the pre-charge period.

4. The non-volatile memory device according to claim 1, wherein the dummy cell control logic controls the gate voltage of the at least one dummy cell to be higher than the threshold voltage of the at least one dummy cell after an end of the pre-charge period.

5. The non-volatile memory device according to claim 1, wherein select transistor control logic is configured, when executed, to control a gate voltage of the ground select transistor to be higher than a threshold voltage of the ground select transistor in the pre-charge period.

6. The non-volatile memory device according to claim 1, wherein select transistor control logic is configured, when executed, to control a gate voltage of the ground select transistor to be lower than a threshold voltage of the ground select transistor in at least a part of the pre-charge period.

7. The non-volatile memory device according to claim 6, wherein the select transistor control logic controls the gate voltage of the ground select transistor to be higher than the threshold voltage of the ground select transistor before an end of the pre-charge period.

8. The non-volatile memory device according to claim 1, wherein the dummy cell control logic controls the gate voltage of the at least one dummy cell in order to set the threshold voltage of the at least one dummy cell.

9. The non-volatile memory device according to claim 1, further comprising:
a substrate,
wherein the at least one memory cell, the at least one dummy cell, and the ground select transistor are respectively connected to at least one word line, at least one dummy word line, and at least one ground select line that are vertically stacked on the substrate.

10. The non-volatile memory device according to claim 1, wherein the cell string is a NAND cell string.

11. A non-volatile memory device, comprising:
a memory cell array comprising a plurality of cell strings each comprising at least one dummy cell;
a page buffer connected to the memory cell array through a plurality of bit lines and pre-charging at least one of the plurality of bit lines; and
a controller that executes dummy cell control logic configured to control a gate voltage of the at least one dummy cell and to control a turn off voltage of the at least one dummy cell to be applied to a gate of the at least one dummy cell in at least a part of a pre-charge period in which the page buffer pre-charges at least one of the plurality of bit lines,
wherein the dummy cell control logic controls a gate voltage of at least one dummy cell to switch between a turn on voltage and a turn off voltage of each of the at least one dummy cell at least once in the pre-charge period in which the page buffer pre-charges the at least one of the plurality of bit lines.

12. The non-volatile memory device according to claim 11,
wherein each of the plurality of cell strings further comprises at least one memory cell and at least one ground select transistor, and
wherein the at least one dummy cell is disposed between the at least one memory cell and the at least one ground select transistor.

13. The non-volatile memory device according to claim 12,
wherein select transistor control logic is configured, when executed, to control a gate voltage of the at least one ground select transistor, and
wherein the select transistor control logic controls a turn on voltage of the at least one ground select transistor to be applied to a gate of the at least one ground select transistor in the pre-charge period in which the page buffer pre-charges the at least one of the plurality of bit lines.

14. A method for controlling a non-volatile memory device, comprising:
setting a threshold voltage of at least one dummy cell in a cell string of the non-volatile memory device;
controlling, by a controller in the non-volatile memory device, a gate voltage of the at least one dummy cell to be lower than the threshold voltage of the at least one dummy cell in at least a part of a pre-charge period by executing dummy cell control logic, and
controlling, by the controller, a gate voltage of at least one dummy cell to switch between a turn on voltage and a turn off voltage of each of the at least one dummy cell at least once in the pre-charge period,
wherein the at least one dummy cell is between at least one memory cell and a ground select transistor in the cell string, and
wherein the at least one dummy cell is connected to a bit line.

15. The method for controlling a non-volatile memory device according to claim 14, further comprising:
applying, by a page buffer connected to the bit line, a pre-charge voltage to the bit line in the pre-charge period to isolate the cell string from a common source line.

16. The method for controlling a non-volatile memory device according to claim 14,
wherein the dummy cell control logic controls the gate voltage of the at least one dummy cell to be lower than the threshold voltage of the at least one dummy cell before a start of the pre-charge period, and
wherein the dummy cell control logic controls the gate voltage of the at least one dummy cell to be higher than the threshold voltage of the at least one dummy cell after an end of the pre-charge period so that a read operation can be performed.

17. The method for controlling a non-volatile memory device according to claim 14,
wherein the dummy cell control logic controls the gate voltage of the at least one dummy cell in order to set the threshold voltage of the at least one dummy cell.

18. The method for controlling a non-volatile memory device according to claim 14,
wherein the cell string is a NAND cell string, and
wherein the non-volatile memory device comprises a memory cell array that includes the cell string and a page buffer connected to the memory cell array through a plurality of bit lines and pre-charging at least one of the plurality of bit lines.

\* \* \* \* \*